(12) United States Patent
Chen et al.

(10) Patent No.: US 10,312,123 B2
(45) Date of Patent: Jun. 4, 2019

(54) METHOD FOR COMPENSATING PROBE MISPLACEMENT AND PROBE APPARATUS

(71) Applicant: MPI Corporation, Chu-pei, Hsinchu County (TW)

(72) Inventors: Chen-Ching Chen, Chu-pei (TW); Yu-Hsun Hsu, Chu-pei (TW); Po-Yi Ting, Chu-pei (TW); Stojan Kanev, Chu-pei (TW)

(73) Assignee: MPI CORPORATION, Chu-Pei, Hsinchu County (TW)

( * ) Notice: Subject to any disclaimer, the term of this patent is extended or adjusted under 35 U.S.C. 154(b) by 0 days.

(21) Appl. No.: 15/414,852

(22) Filed: Jan. 25, 2017

(65) Prior Publication Data

US 2017/0219650 A1    Aug. 3, 2017

Related U.S. Application Data

(60) Provisional application No. 62/288,698, filed on Jan. 29, 2016.

(51) Int. Cl.
| | |
|---|---|
| *G01R 31/28* | (2006.01) |
| *H01L 21/677* | (2006.01) |
| *A47B 88/497* | (2017.01) |
| *A47B 88/457* | (2017.01) |
| *G01K 13/00* | (2006.01) |
| *H01L 21/673* | (2006.01) |

(Continued)

(52) U.S. Cl.
CPC ........ *H01L 21/6773* (2013.01); *A47B 88/457* (2017.01); *A47B 88/497* (2017.01); *G01K 13/00* (2013.01); *G01R 31/2891* (2013.01); *G01R 31/44* (2013.01); *H01L 21/67346* (2013.01); *H01L 21/67386* (2013.01); *A47B 88/988* (2017.01)

(58) Field of Classification Search
CPC .......... G01R 31/2891; H01L 21/67386; H01L 21/6773
See application file for complete search history.

(56) References Cited

U.S. PATENT DOCUMENTS

| | | | |
|---|---|---|---|
| 6,239,590 B1* | 5/2001 | Krivy ................. | G01R 35/005 324/750.02 |
| 9,322,843 B1* | 4/2016 | Tsironis ............. | G01R 1/06705 |

(Continued)

*Primary Examiner* — Giovanni Astacio-Oquendo
*Assistant Examiner* — Alvaro E Fortich
(74) *Attorney, Agent, or Firm* — McClure, Qualey & Rodack, LLP

(57) ABSTRACT

A method for compensating probe misplacement and a probe apparatus are provided. The method is applicable to a probe module which includes a probe and a fixing base. The probe includes a probe body section and a probe tip section. The probe body section is fixed on the fixing base. The method includes: measuring a temperature of a probe body of the probe body section of the probe; calculating, according to the temperature of the probe body, thermal expansion amount of the probe along a length direction of the probe body section; calculating a compensation value according to the thermal expansion amount; moving the probe or a to-be-tested element according to the calculated compensation value, to align a probe tip of the probe tip section with the to-be-tested element or align the to-be-tested element with the probe tip of the probe tip section.

5 Claims, 4 Drawing Sheets

(51) Int. Cl.
   *G01R 31/44*   (2006.01)
   *A47B 88/988*  (2017.01)

(56) References Cited

U.S. PATENT DOCUMENTS

| | | | | |
|---|---|---|---|---|
| 2004/0066508 A1* | 4/2004 | Schmadel | ............ | G01B 21/042 |
| | | | | 356/243.1 |
| 2008/0116917 A1* | 5/2008 | Kanev | ................ | G01R 31/2889 |
| | | | | 324/750.19 |
| 2009/0166197 A1* | 7/2009 | Grincourt | .......... | G01N 27/4045 |
| | | | | 204/412 |
| 2009/0241360 A1* | 10/2009 | Tait | ...................... | G01B 21/042 |
| | | | | 33/502 |
| 2010/0156449 A1* | 6/2010 | Nitta | .................. | G01R 31/2875 |
| | | | | 324/756.03 |
| 2010/0164520 A1* | 7/2010 | Kiyofuji | ............ | G01R 31/2875 |
| | | | | 324/756.03 |
| 2010/0201390 A1* | 8/2010 | Takahaski | .......... | G01R 1/07342 |
| | | | | 324/756.03 |
| 2010/0325907 A1* | 12/2010 | Tait | ........................ | G01B 5/008 |
| | | | | 33/503 |
| 2011/0128024 A1* | 6/2011 | Kiyokawa | ........... | G01R 31/2891 |
| | | | | 324/750.16 |
| 2011/0241711 A1* | 10/2011 | Teich | ................. | G01R 31/2874 |
| | | | | 324/750.03 |
| 2013/0027070 A1* | 1/2013 | Dietrich | ............. | G01R 31/2891 |
| | | | | 324/754.03 |
| 2013/0207683 A1* | 8/2013 | Tanaka | ............... | G01R 1/07378 |
| | | | | 324/756.03 |
| 2016/0139068 A1* | 5/2016 | Han | ....................... | G01N 25/16 |
| | | | | 702/136 |

* cited by examiner

METHOD FOR COMPENSATING PROBE MISPLACEMENT AND PROBE APPARATUS

CROSS-REFERENCE TO RELATED APPLICATION

This non-provisional application claims priority under 35 U.S.C. § 119(e) to U.S. Provisional Patent Application No. 62/288,698, filed on Jan. 29, 2016, the entire contents of which are hereby incorporated by reference.

BACKGROUND

Technical Field

The present invention relates to a method for compensating probe misplacement, and in particular, to a method for compensating probe misplacement caused by thermal expansion.

Related Art

In the field of wafer testing, a to-be-tested element needs to be heated to a particular temperature, to meet some particular testing requirements. In this case, because a probe itself is made of metal and has a relatively long length, thermal expansion may occur. As a result, although a tip of the probe and the to-be-tested element are aligned at normal temperature, misplacement may occur after the temperature rises to a high temperature.

SUMMARY

Therefore, a first concept of the present invention provides a method for compensating probe misplacement, applicable to a probe module, where the probe module includes a probe and a fixing base, the probe includes a probe body section and a probe tip section, and the probe body section is fixed on the fixing base. The method for compensating probe misplacement includes: measuring a temperature of a probe body of the probe body section of the probe or a temperature of a probe body in an environment around the probe body section; calculating, according to the temperature of the probe body, thermal expansion amount of the probe along a length direction of the probe body section; and calculating a compensation value according to the thermal expansion amount.

According to the first concept of the present invention, the foregoing method for compensating probe misplacement may further include: moving the probe module according to the calculated compensation value, to align a probe tip of the probe tip section with a to-be-tested element.

According to the first concept of the present invention, the foregoing method for compensating probe misplacement may further include: moving the to-be-tested element according to the calculated compensation value, to align the to-be-tested element with the probe tip of the probe tip section.

According to the first concept of the present invention, in the foregoing method for compensating probe misplacement, a temperature measurement unit may be disposed on the fixing base of the probe, to measure the temperature of the probe body of the probe body section of the probe.

A second concept of the present invention is a probe module, including: a fixing base; a probe, including a probe tip section and a probe body section, where the probe body section is fixed on the fixing base; and a temperature measurement unit, disposed on the fixing base or the probe, to measure a temperature of a probe body of the probe body section of the probe or a temperature of a probe body in an environment around the probe body section.

According to the second concept of the present invention, the foregoing probe module may further include a calculation module, electrically connected to the temperature measurement unit, where the calculation module calculates, according to the temperature of the probe body, thermal expansion amount of the probe along a length direction of the probe body section, and calculates a compensation value according to the thermal expansion amount.

According to the second concept of the present invention, the foregoing probe module may further include a drive module, electrically connected to the calculation module, where the drive module moves the probe according to the calculated compensation value, to align a probe tip of the probe tip section with a to-be-tested element.

According to the second concept of the present invention, the foregoing probe module may further include a drive module, electrically connected to the calculation module, where the drive module moves the to-be-tested element according to the calculated compensation value, to align the to-be-tested element with the probe tip of the probe tip section.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
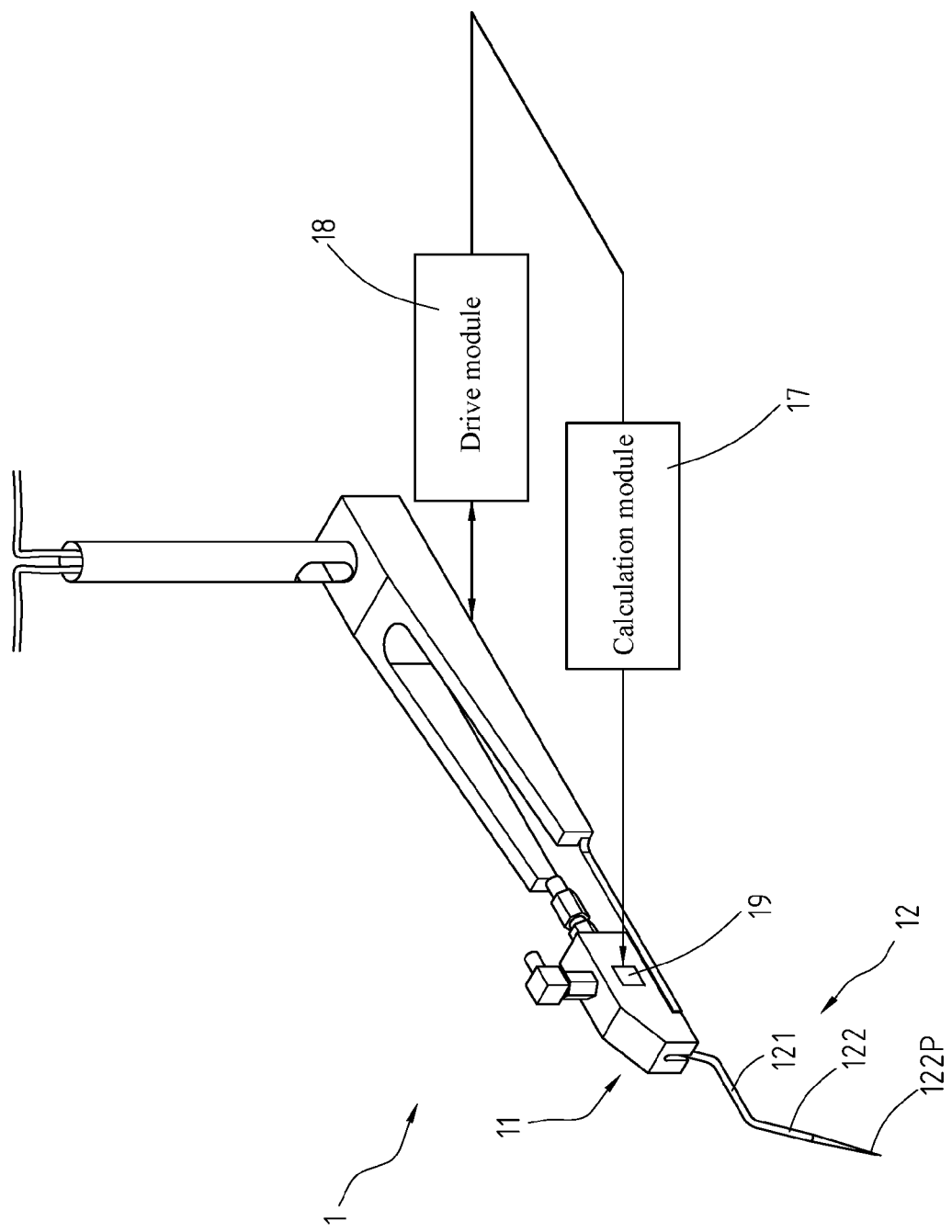
FIG. 1 is a schematic diagram of a probe module (1).

Referring to FIG. 1 to FIG. 4, FIG. 1 to FIG. 4 are respectively a schematic diagram of a probe module (1), a schematic diagram of a probe module (2), a schematic diagram of correct alignment of a probe, and a schematic diagram of misplacement of a probe. A first embodiment of the present invention provides a method for compensating probe misplacement, applicable to a probe module 1 shown in FIG. 1. The probe module 1 includes a probe 12 and a fixing base 11, the probe 12 includes a probe body section 121 and a probe tip section 122, the probe body section 121 is fixed on the fixing base 11 and disposed on a probe platform 15 shown in FIG. 2, and the probe tip section 122 is exposed out of the fixing base 11.

When a to-be-tested element 9 that is disposed on a platform 16 for a to-be-tested object needs to be heated to a particular temperature to meet some special testing requirements, because a conventional probe 8 is made of metal and has a relatively long length, relatively high-degree thermal expansion may occur. In this case, an alignment condition that can be met at normal temperature is not applicable at high temperature, and misplacement shown in FIG. 3 may occur.

To resolve the foregoing misplacement, in the method for compensating probe misplacement in this embodiment, a temperature of a probe body of the probe body section 121 of the probe 12 or a temperature of a probe body in an environment around the probe body section is measured. Because a material of the probe 12 is known, a coefficient of thermal expansion of the probe 12 is also known. Therefore, thermal expansion amount of the probe 12 along a length direction of the probe body section 121 may be calculated according to the measured temperature of the probe body, and further a compensation value is calculated according to the calculated thermal expansion amount. In this case, the probe module 1 may be moved according to the calculated compensation value, to align a probe tip 122P of the probe tip section 122 with the to-be-tested element 9; or the to-be-tested element 9 is moved according to the calculated compensation value, to align the to-be-tested element 9 with the probe tip 122P of the probe tip section 122, as shown in FIG. 2.

In this embodiment, the measurement of the temperature of the probe body of the probe body section 121 of the probe 12 may be implemented by disposing a temperature measurement unit 19 on the fixing base 11 of the probe module 1.

Figure 2:
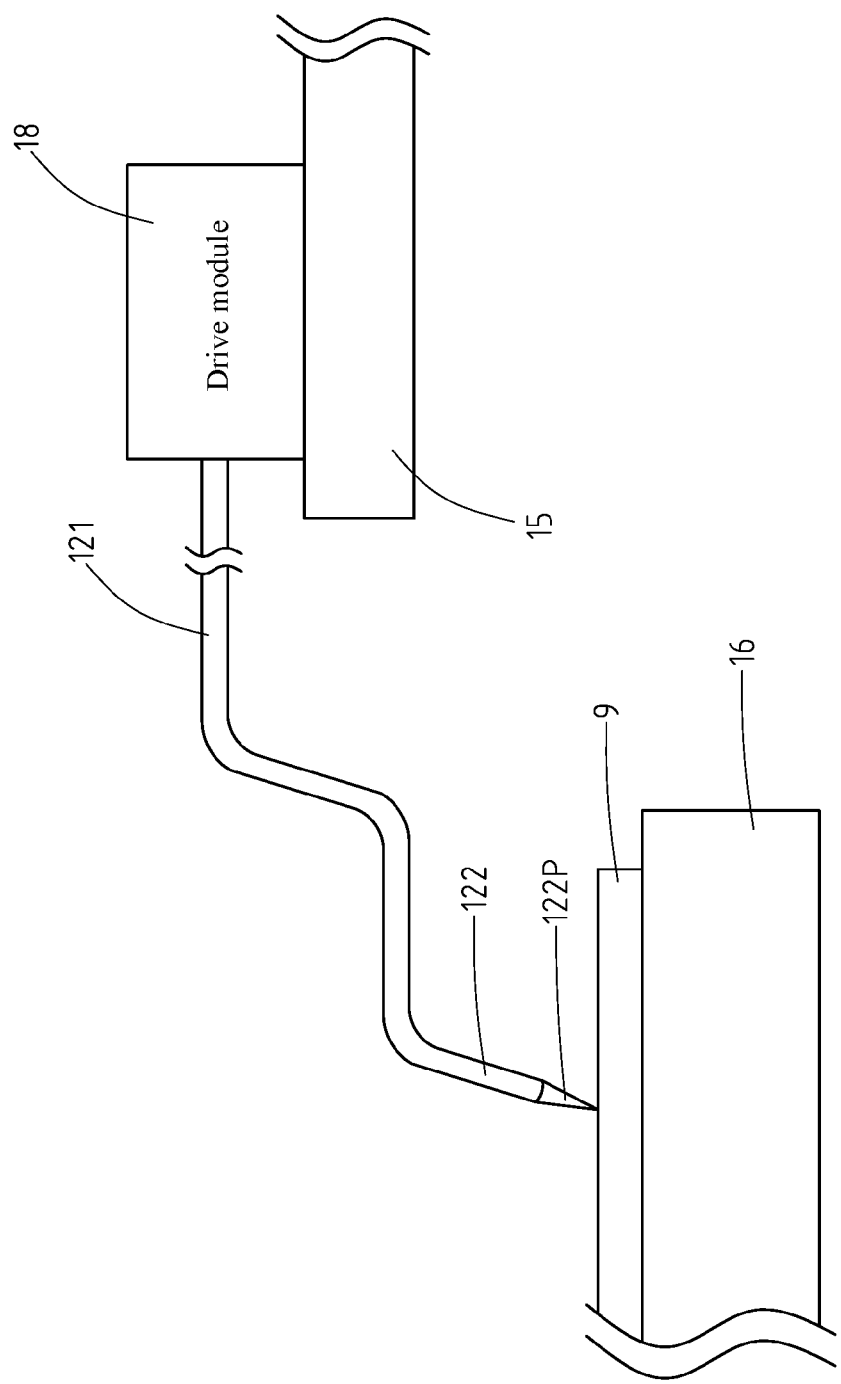
FIG. 2 is a schematic diagram of a probe module (2).

A second embodiment provided in the present invention is a probe module, as shown in FIG. 1 and FIG. 2. A probe module 1 includes a fixing base 11, a probe 12, and a temperature measurement unit 19. The probe 12 includes a probe body section 121 and a probe tip section 122, where the probe body section 121 is fixed on the fixing base 11, and the probe tip section 122 is exposed out of the fixing base. The temperature measurement unit 19 is disposed on the fixing base 11, to measure a temperature of a probe body of the probe body section 121 of the probe 12.

The probe module 1 in this embodiment may further include a calculation module 17, electrically connected to the temperature measurement unit 19, where the calculation module 17 calculates, according to the temperature of the probe body, thermal expansion amount of the probe 12 along a length direction of the probe body section 121, and calculates a compensation value according to the thermal expansion amount.

Figure 3:
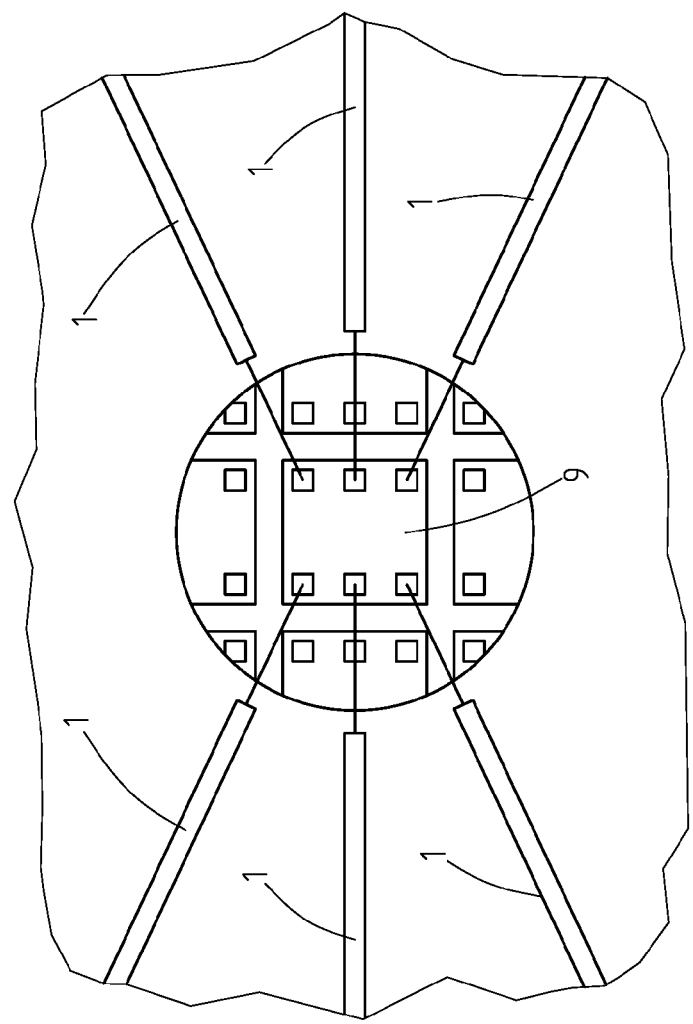
FIG. 3 is a schematic diagram of correct alignment of a probe.
Figure 4:
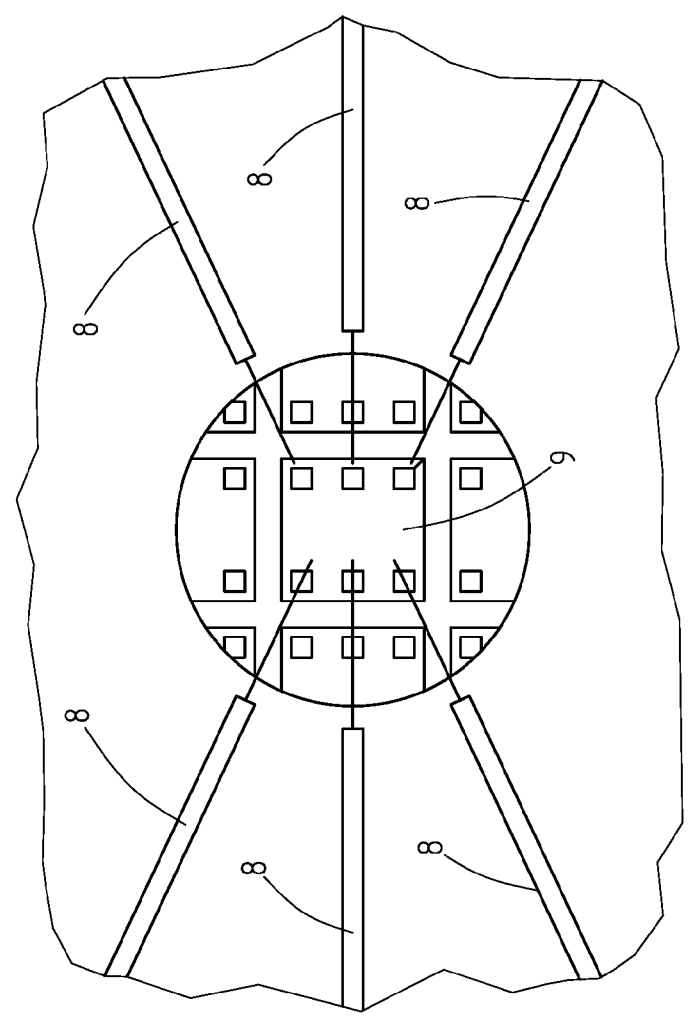
FIG. 4 is a schematic diagram of misplacement of a probe.

The probe module 1 in this embodiment may further include a drive module 18, electrically connected to a calculation module 17, where the drive module moves the probe 12 according to the compensation value calculated by the calculation module 17, to align a probe tip 122P of the probe tip section 122 with a to-be-tested element 9; or moves the to-be-tested element 9 according to the compensation value calculated by the calculation module 17, to align the to-be-tested element 9 with the probe tip 122P of the probe tip section 122, as shown in FIG. 3.

The calculation of the compensation value may be performed after a whole testing environment reaches heat balance, and therefore compensation only needs to be performed once during a whole testing process. In addition, a manner of real-time measurement and real-time compensation may be used, that is, continuously measuring the temperature of the probe body section 121 of the probe 12, and then continuously calculating a compensation value, and continuously moving the probe 12 or the to-be-tested element 9 according to the compensation value, to align the to-be-tested element 9 with the probe tip 122P.

The method for compensating probe misplacement and the probe module provided in the foregoing embodiment has the following features:

(1) Because temperature changes always cause offsets of all mechanical elements in three axis of XYZ, the temperature measurement unit 19 needs to be close to the to-be-tested element 9 as much as possible, for example, by disposing the temperature measurement unit on the fixing base 11 or the probe 12.

(2) The temperature measurement unit 19 may have statuses of wired and wireless transmission, as introduced in the following hyperlink (http://bgr.com/2015/12/08/iot-devices-sensors-no-battery-radio-waves/).

(3) The drive module 18 is a carrier of offset in at least one axis. The present invention does not measure a compensation value, but obtains the compensation value by calculating or referring to a reference table according to temperature measurement. The reference table is a data table of a correspondence between temperatures and compensation values that is stored in the calculation module 17.

(5) Although there may be offsets in directions of three dimensions, a length of the probe body section 121 is far greater than a diameter of a section of the probe body section, and therefore a length direction of the probe body section 121 is a direction that needs compensation.

(6) A whole operation of compensation may be performed at any time, that is, once a temperature measurement value of the temperature measurement unit 19 changes, a compensation value is obtained at once, and then the drive module 18 performs compensation in real time. In addition, a compensation value may be calculated when the temperature measurement value of the temperature measurement unit 19 reaches a threshold, and then the drive module 18 performs compensation.

(7) To enable the probe to continuously touch a to-be-tested element, the drive module 18 is a carrier that can move in 6 axial directions at most, and therefore, completely compensates offsets caused by temperature changes, so that the probe continuously touches the to-be-tested element.

(8) The drive module 18 may include one of the following types of motors, for example, a liner motor (liner motor), a DC motor (DC motor), a stepper (stepper), or a piezoelectricity-driven motor. The piezoelectricity-driven motor may be selected from products developed by the MICRONIX USA, LLC company, for example, a NANO POSITIONING—PIEZO series, http://www.micronixusa.com/.

(9) To achieve a relatively good compensation effect, the drive module 18 may further be thermally isolated from a chuck (Chuck) for a to-be-tested object, so as to avoid that the drive module 18 is affected by thermal expansion.

(10) To achieve a relatively good compensation effect, a temperature of a probe platform may be constant, that is, the probe platform is isolated from the chuck for a to-be-tested object.

(11) The calculation module 17 may simultaneously control at least one drive module 18, and one drive module 18 may move at least one probe module.

(12) As shown in the drawings, the probe may be directly fixed on the drive module 18. Or, the drive module 18 is integrated with the fixing base 11.

What is claimed is:

1. A method for compensating probe misplacement, applicable to a probe module, wherein the probe module comprises a probe and a fixing base, the probe comprises a probe body section and a probe tip section, and the probe body section is fixed on the fixing base, the method for compensating probe misplacement comprising:

measuring a temperature of a probe body of the probe body section of the probe by a temperature measurement sensor disposed on the fixing base of the probe;

calculating, according to the temperature of the probe body, thermal expansion amount of the probe along a length direction of the probe body section by a calculation circuit electrically connected to the temperature measurement sensor;

calculating a compensation value according to the thermal expansion amount by the calculation circuit; and moving the probe module according to the compensation value, to align a probe tip of the probe tip section with a to-be-tested element.

2. A probe module, comprising: a fixing base;
a probe, comprising a probe tip section and a probe body section, wherein the probe body section is fixed on the fixing base, and the probe tip section is exposed out of the fixing base;
a temperature measurement sensor, disposed on the fixing base, to measure a temperature of a probe body of the probe body section of the probe and
a calculation circuit, electrically connected to the temperature measurement sensor, and configured to calculate a thermal expansion amount of the probe along a length direction of the probe body section according to the temperature of the probe body, and to calculate a compensation value according to the thermal expansion amount.

3. The probe module according to claim 2, further comprising a driver, electrically connected to the calculation circuit, wherein the driver moves the fixing base according to the compensation value, to align a probe tip of the probe tip section with a to-be-tested element.

4. The probe module according to claim 2, further comprising a driver, electrically connected to the calculation circuit, wherein the driver moves a to-be-tested element according to the compensation value, to align the to-be-tested element with a probe tip of the probe tip section.

5. A method for compensating probe misplacement, applicable to a probe module, wherein the probe module comprises a probe and a fixing base, the probe comprises a probe body section and a probe tip section, and the probe body section is fixed on the fixing base, the method for compensating probe misplacement comprising:
measuring a temperature of a probe body of the probe body section of the probe by a temperature measurement sensor disposed on the fixing base of the probe;
calculating, according to the temperature of the probe body, thermal expansion amount of the probe along a length direction of the probe body section by a calculation circuit electrically connected to the temperature measurement sensor;
calculating a compensation value according to the thermal expansion amount by the calculation circuit; and
moving a to-be-tested element according to the compensation value, to align the to-be- tested element with a probe tip of the probe tip section.

\* \* \* \* \*